United States Patent
Liu

(10) Patent No.: US 11,132,144 B2
(45) Date of Patent: Sep. 28, 2021

(54) INTEGRATED INTERFACE AND ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cheng-Xiang Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 78 days.

(21) Appl. No.: 16/669,645

(22) Filed: Oct. 31, 2019

(65) Prior Publication Data

US 2020/0341683 A1 Oct. 29, 2020

(30) Foreign Application Priority Data

Apr. 26, 2019 (CN) .......................... 201910345929.0

(51) Int. Cl.
*G06F 3/06* (2006.01)
*G06F 1/26* (2006.01)

(52) U.S. Cl.
CPC .......... *G06F 3/0658* (2013.01); *G06F 3/0626* (2013.01); *G06F 3/0679* (2013.01); *G06F 1/266* (2013.01)

(58) Field of Classification Search
CPC ....... G06K 19/07733; G06K 19/07732; G06K 19/07; G06K 19/07743; G06K 19/07769; G06K 19/07739; G06K 19/077; G06F 1/266; G06F 3/0658; G06F 3/0626; G06F 3/0679; G11C 5/143
See application file for complete search history.

(56) References Cited

U.S. PATENT DOCUMENTS

| 2005/0045720 A1* | 3/2005 | Fruhauf ........... G06K 19/07769 235/440 |
| 2006/0047982 A1* | 3/2006 | Lo .......................... G06F 1/266 713/300 |

(Continued)

OTHER PUBLICATIONS

Components101. "Micro B USB Jack Pinout" Published Apr. 2018. <https://components101.com/connectors/micro-usb-pinout-datasheet>. (Year: 2018).*

(Continued)

*Primary Examiner* — Charles Rones
*Assistant Examiner* — Hewy H Li
(74) *Attorney, Agent, or Firm* — ScienBiziP, P.C.

(57) ABSTRACT

An integrated interface for an electronic device without a USB port includes at least one SIM card interface drive chip, a USB interface control chip, at least one SIM card interface control chip electronically connected to the at least one SIM card interface drive chip and the USB interface control chip, and a USB interface drive chip electronically connected to the USB interface control chip. A detection signal pin is defined on the USB interface control chip. When the detection signal pin is triggered, the USB interface control chip is turned on and the SIM card interface drive chip is turned off. When triggered, the USB interface drive chip drives the USB interface control chip to work, allowing access by an external whole-machine probe or test device.

14 Claims, 3 Drawing Sheets

(56) References Cited

U.S. PATENT DOCUMENTS

2009/0043935 A1* 2/2009 Huomo ............ G06K 19/07733
710/301
2018/0110081 A1* 4/2018 Serna .................. H04W 12/068

OTHER PUBLICATIONS

AllAboutCircuits. "Guide to USB-C Pinout and Features". Published Dec. 2018. <https://www.allaboutcircuits.com/technical-articles/introduction-to-usb-type-c-which-pins-power-delivery-data-transfer/>. (Year: 2018).*

Schweber. "Drivers: The Critical Interface Between a Circuit and Its Load". Published Aug. 2016. <https://electronics360.globalspec.com/article/7114/drivers-the-critical-interface-between-a-circuit-and-its-load#>. (Year: 2016).*

* cited by examiner

INTEGRATED INTERFACE AND ELECTRONIC DEVICE

This application claims priority to Chinese Patent Application No. 201910345929.0 filed on Apr. 26, 2019, the contents of which are incorporated by reference herein.

FIELD

The subject matter herein generally relates to electronic devices.

BACKGROUND

Many electronic devices have capabilities of wireless charging and connectivity to wireless headphones, thereby reducing the number of interfaces, such as headphones or USB port. However, fault repair equipment in the factory needs to test the whole device by a USB interface. An absence of a USB interface in the electronic device thus can cause inconvenience in the testing.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
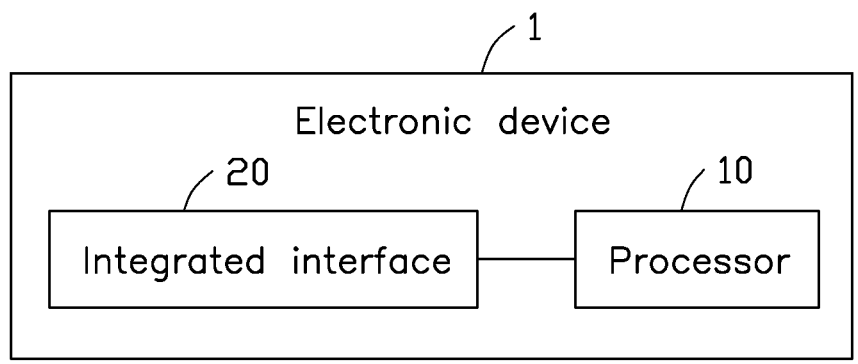
FIG. 1 is a block diagram of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

The term "comprising" means "including, but not necessarily limited to"; it specifically indicates open-ended inclusion or membership in a so-described combination, group, series, and the like.

Embodiments of the present disclosure will be described in relation to the accompanying drawings.

FIG. 1 illustrates an electronic device 1. The electronic device 1 includes, but is not limited to, a processor 10 and an integrated interface 20. In one embodiment, the electronic device 1 can be a smartphone, a tablet, or other portable electronic device.

In one embodiment, the processor 10 is a microprocessing chip or a SOC (System On Chip, system-level chip), electrical connection with the integration interface 20. The processor 10 processes signals sent by the integrated interface 20. In one embodiment, the integrated interface 20 is integrated with a SIM card interface and a USB interface, which can be inserted into the SIM card or USB interface connector to achieve functionality.

Figure 2:
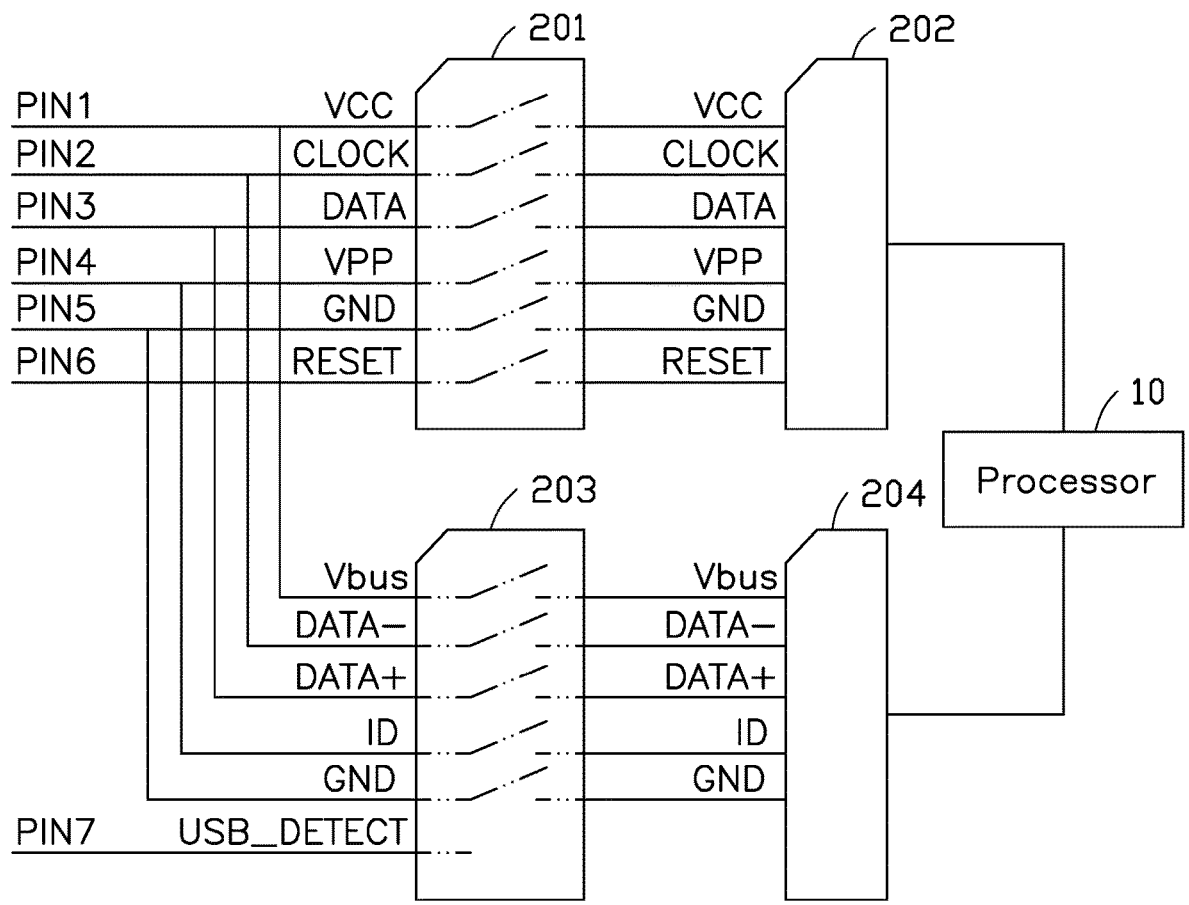
FIG. 2 is a block diagram of an embodiment of an integrated interface in the electronic device in FIG. 1.

FIG. 2 illustrates the integrated interface 20. The integrated interface 20 includes at least one SIM card interface control chip 201, at least one SIM card interface drive chip 202, a USB interface control chip, and a USB interface drive chip. In one embodiment, the USB interface control chip can be a micro USB interface control chip 203, and the USB interface drive chip can be a micro USB interface drive chip 204. In one embodiment, the SIM card interface control chip 201 electronically connects to the SIM card interface drive chip 202 and the micro USB interface control chip 203. The micro USB interface control chip 203 electronically connects to the micro USB interface drive chip 204.

In at least one embodiment, the micro USB interface control chip 203 defines a detection signal pin USB_DETECT. When the detection signal pin USB_DETECT is triggered, the Micro USB interface control chip 203 is turned on, and the micro USB interface drive chip 204 drives the Micro USB interface control chip 203. At this point, the SIM card interface control chip 201 stops working. In one embodiment, a default state of the detection signal pin USB_DETECT is an untriggered state. When the detection signal pin USB_DETECT is in the untriggered state, the SIM card interface control chip 201 is turned on, and the SIM card interface driver chip 202 drives the SIM card interface control chip 201 to operate.

In one embodiment, when a SIM card is plugged into the integrated interface 20, the detection signal pin USB_DETECT is not triggered, the SIM card interface control chip 201 is turned on, and the SIM card interface drive chip 202 drives the SIM card interface control chip 201 to work. When a USB interface connector is plugged into the integrated interface 20, the detection signal pin USB_DETECT is triggered, the Micro USB interface control chip 203 is turned on, and the Micro USB interface drive chip 204 drives the Micro USB interface control chip 203 to work.

When a USB interface connector is plugged into the integrated interface 20, the detection signal pin USB_DETECT is triggered, the Micro USB interface control chip 203 is turned on, and the Micro USB interface drive chip 204 drives the Micro USB interface control chip 203 to work.

In one embodiment, the USB interface connector is a USB terminal common in the existing technology. The size of the integrated interface 20 is the same as the size of the USB interface in the existing technology, in order to facilitate the connection of the USB terminal. In other embodiments, the USB interface connector may also be a USB test terminal specifically designed for testing. The size of the integrated interface 20 is the same as the size of the SIM card interface in the existing technology, in order to facilitate the connection of the USB test terminal.

In one embodiment, referring to FIG. 2, the integrated interface 20 includes one SIM card interface control chip 201 and one SIM card interface drive chip 202. The SIM card interface control chip 201 includes a first power signal pin VCC, a clock signal pin CLOCK, a data signal pin DATA, a programming voltage pin VPP, a first ground pin GND, and a reset signal pin RESET.

The micro USB interface control chip 203 includes at least one second power signal pin Vbus, a first data cable negative pin DATA−, a first data cable positive pin DATA+, an identification pin ID, and a second ground pin GND. The second power signal pin Vbus is connected electrically to the first power signal pin VCC. The first data cable negative pin DATA− is connected electrically to the clock signal pin CLOCK. The first data cable positive pin DATA+ is electrically connected to the data signal pin DATA. The identification pin ID is electrically connected to the programming voltage pin VPP, and the second ground pin GND is connected electronically to the first ground pin GND.

In the default state of the detection signal pin USB_DETECT, the detection signal pin USB_DETECT in not triggered. The SIM card interface control chip 201 is turned on, and the SIM card interface driver chip 202 drives the SIM card interface control chip 201 to work, and the micro USB interface control chip 203 is turned off. When a USB interface connector is plugged into the integrated interface 20, the detection signal pin USB_DETECT is triggered, the micro USB interface control chip 203 is turned on, and the micro USB interface drive chip 204 drives the micro USB interface control chip 203 to work. The SIM card interface control chip 201 is turned off.

Figure 3:
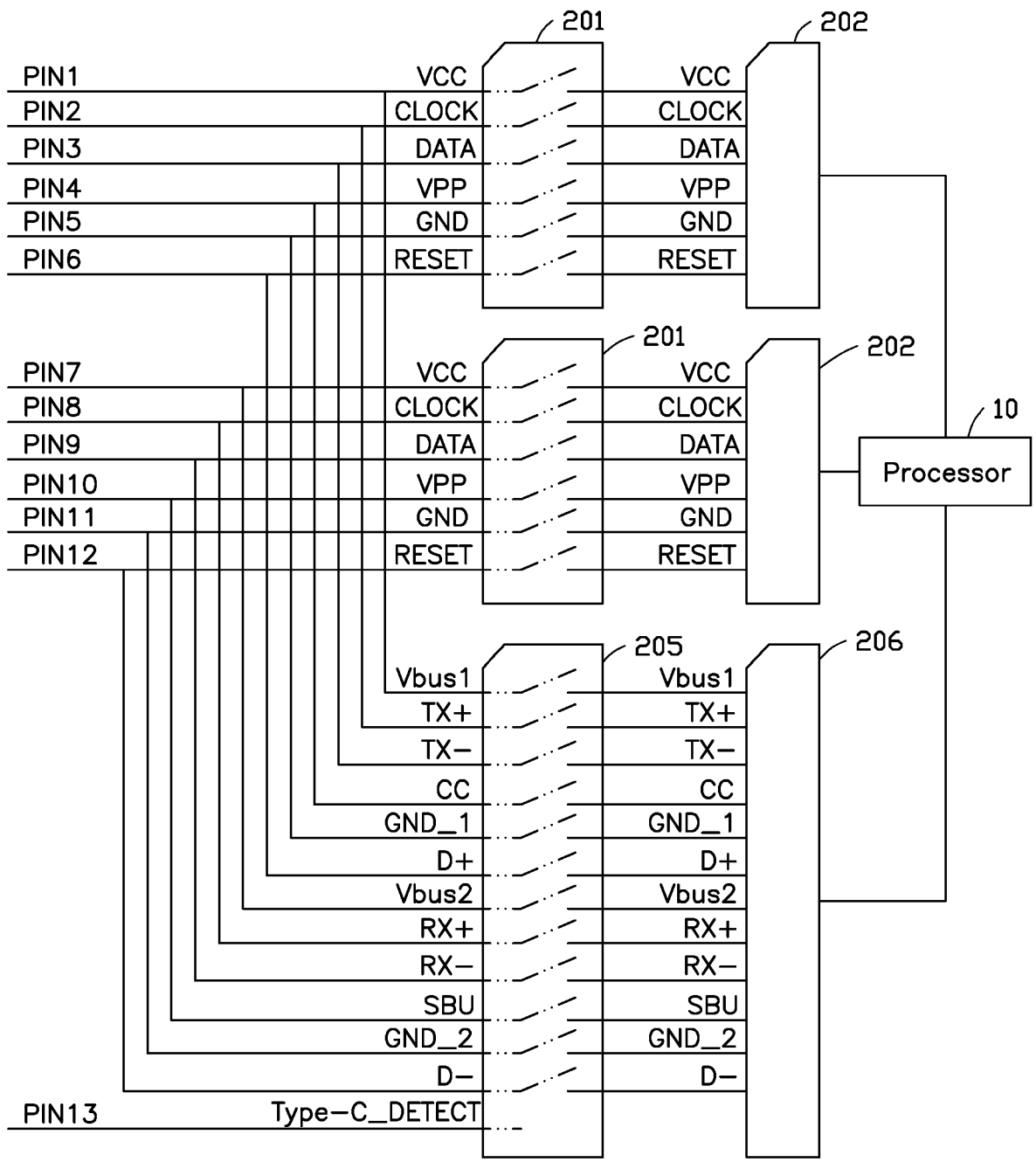
FIG. 3 is another block diagram of an integrated interface in the electronic device in FIG. 1.

FIG. 3 illustrates another integrated interface 20. The integrated interface 20 includes two SIM card interface control chips 201 and two SIM card interface drive chips 202. Each of the two SIM card interface control chips 201 includes the first power signal pin VCC, the clock signal pin CLOCK, the data signal pin DATA, the programming voltage pin VPP, the first ground pin GND, and the reset signal pin RESET.

In one embodiment, the USB interface control chip is Type-C interface control chip 205, and the USB interface drive chip is Type-C interface drive chip 206. The Type-C interface control chip 205 includes at least two third-power signal pins Vbus1 that are set relatively and in opposite order. Two sending positive signal pins TX+ are set relatively and in opposite order, and two sending negative signal pins TX− are set relatively and in opposite order are also included. There are two voltage detection pins CC that are set relatively and in opposite order, two third ground pins GND_1 that are set relatively and in opposite order, and two second-wire positive pins D+ that are set relatively and in opposite order. There are also two fourth-power signal pins Vbus2 that are set relatively and in opposite order, two receiving positive signal pins RX+ that are set relatively and in opposite order, and two receiving negative signal pins RX− that are set relatively and in opposite order. Finally, there are two auxiliary signal pins SBU that are set relatively and in opposite order, two fourth ground pins GND_2 that are set relatively and in opposite order, and two second-wire negative pins D− that are set relatively and in opposite order. FIG. 3 shows only the pins on one side of the Type-C interface control chip 205, and the pin order of the pins on the other side is the opposite of the order shown in FIG. 3.

In one embodiment, the third power signal pin Vbus1 is electronically connected to the first power signal pin VCC of one of the two SIM card interface control chips 201. The sending positive signal pin TX+ is electronically connected to the clock signal pin CLOCK of one of the two SIM card interface control chips 201. The sending negative signal pin TX− is electronically connected to the data signal pin DATA of one of the two SIM card interface control chips 201. The voltage detection pin CC is electronically connected to the programming voltage pin VPP of one of the two SIM card interface control chips 201. The third ground pin GND_1 is electronically connected to the first ground pin GND of one of the two SIM card interface control chips 201. The second-wire positive pin D+ is electronically connected to the reset signal pin RESET of one of the two SIM card interface control chips 201. The fourth power signal pin Vbus2 is electronically connected to the first power signal pin VCC of the other of the two SIM card interface control chips 201. The receiving positive signal pin RX+ is electronically connected to the clock signal pin CLOCK of the other of the two SIM card interface control chips 201. The receiving negative signal pin RX− is electronically connected to the data signal pin DATA of the other of the two SIM card interface control chips 201. The auxiliary signal pin SBU is electronically connected to the programming voltage pin VPP of the other of the two SIM card interface control chips 201. The fourth ground pin GND_2 is electronically connected to the first ground pin GND of the other of the two SIM card interface control chips 201. The second data line negative pin D− is electronically connected to the reset signal pin RESET of the other of the two SIM card interface control chips 201.

In the default state of the Type-C interface control chip 205, the detection signal pin Type-C_DETECT of the Type-C interface control chip 205 is not triggered, and the SIM card interface control chip 201 is turned on. The SIM card interface drive chip 202 drives the SIM card interface control chip 201 to work, and the Type-C interface control chip 205 is turned off. When a USB interface connector is plugged into the integrated interface 20, the detection signal pin Type-C_DETECT is triggered, and the Type-C interface control chip 205 is turned on. The Type-C interface drive chip 206 drives the Type-C interface control chip 205 to work, and the SIM card interface control chip 201 is turned off.

The integrated interface 20 in the electronic device 1 of the disclosure has the functions of both the SIM card interface and the USB interface. Either a SIM card or a USB interface connector can be connected and will function. This reduces the number of components inside the electronic device 1 and improves the utilization of the internal space of the electronic device 1. It also renders convenient the use of the USB interface function for inspection, testing, or repair during the production or repair of electronic device 1.

The exemplary embodiments shown and described above are only examples. Even though numerous characteristics and advantages of the present disclosure have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An integrated interface, connected to a processor of an electronic device, comprising:
   at least one SIM card interface drive chip;
   a USB interface control chip;
   at least one SIM card interface control chip electronically connected to the at least one SIM card interface drive chip and the USB interface control chip;
   a USB interface drive chip electronically connected to the USB interface control chip;
   a detection signal pin defined on the USB interface control chip; and
   wherein when the detection signal pin is triggered, the USB interface control chip is turned on, and the USB interface drive chip drives the USB interface control chip to operate, wherein the integrated interface comprises one SIM card interface control chip, the SIM card interface control chip comprises a first power signal pin, a clock signal pin, a data signal pin, a programming voltage pin, a first ground pin and a reset signal pin, the USB interface control chip is a micro USB interface control chip, the micro USB interface control chip comprises a second power signal pin, a first data cable negative pin, a first data cable positive pin, an identification pin, and a second ground pin, wherein the second power signal pin is connected electrically to the first power signal pin, the first data cable negative pin is connected electrically to the clock signal pin, the first data cable positive pin is electrically connected to the data signal pin, the identification pin is electrically connected to the programming voltage pin, and the second ground pin is connected electronically to the first ground pin.

2. The integrated interface as recited in claim 1, wherein a default state of the detection signal pin is an untriggered state, when the detection signal pin is in the untriggered state, the SIM card interface control chip is turned on, and the SIM card interface drive chip drives the SIM card interface control chip to operate.

3. The integrated interface as recited in claim 2, wherein when a SIM card is plugged into the integrated interface, the detection signal pin is not triggered, and the SIM card interface control chip is turned on, and the SIM card interface drive chip drives the SIM card interface control chip to operate; when a USB interface connector is plugged into the integrated interface, the detection signal pin is triggered, the USB interface control chip is turned on, and the USB interface drive chip drives the USB interface control chip to operate.

4. The integrated interface as recited in claim 1, wherein the integrated interface comprises two SIM card interface control chips, each of the two SIM card interface control chips comprises a first power signal pin, a clock signal pin, a data signal pin, a programming voltage pin, a first ground pin and a reset signal pin.

5. The integrated interface as recited in claim 4, wherein the USB interface control chip is a Type-C interface control chip, the Type-C interface control chip comprises a third-power signal pin, a sending positive signal pin, a sending negative signal pin, a voltage detection pin, a third ground pin, a second-wire positive pin, a fourth-power signal pin, a receiving positive signal pin, a receiving negative signal pin, an auxiliary signal pin, a fourth ground pin, and a second-wire negative pin.

6. The integrated interface as recited in claim 5, wherein the third power signal pin is electronically connected to the first power signal pin, the sending positive signal pin is electronically connected to the clock signal pin, the sending negative signal pin is electronically connected to the data signal pin, the voltage detection pin is electronically connected to the programming voltage pin, the third ground pin is electronically connected to the first ground pin, the second-wire positive pin is electronically connected to the reset signal pin, the fourth-power signal pin is electronically connected to the first power signal pin, the receiving positive signal pin is electronically connected to the clock signal pin, the receiving negative signal pin is electronically connected to the data signal pin, the auxiliary signal pin is electronically connected to the programming voltage pin, the fourth ground pin is electronically connected to the first ground pin, and the second-wire negative pin is electronically connected to the reset signal pin.

7. The integrated interface as recited in claim 5, wherein the USB interface drive chip is a Type-C interface drive chip.

8. An electronic device, comprising:
a processor;
an integrated interface connected to the processor, comprising:
at least one SIM card interface drive chip;
a USB interface control chip;
at least one SIM card interface control chip electronically connected to the at least one SIM card interface drive chip and the USB interface control chip;
a USB interface drive chip electronically connected to the USB interface control chip;
a detection signal pin defined on the USB interface control chip; and
wherein when the detection signal pin is triggered, the USB interface control chip is turned on, and the USB interface drive chip drives the USB interface control chip to operate, wherein the integrated interface comprises one SIM card interface control chip, the SIM card interface control chip comprises a first power signal pin, a clock signal pin, a data signal pin, a programming voltage pin, a first ground pin and a reset signal pin, the USB interface control chip is a micro USB interface control chip, the micro USB interface control chip comprises a second power signal pin, a first data cable negative pin, a first data cable positive pin, an identification pin, and a second ground pin, wherein the second power signal pin is connected electrically to the first power signal pin, the first data line negative pin is connected electrically to the clock signal pin, the first data line positive pin is electrically connected to the data signal pin, the identification pin is electrically connected to the programming voltage pin, and the second ground pin is connected electronically to the first ground pin.

9. The electronic device as recited in claim 8, wherein a default state of the detection signal pin is an untriggered state, when the detection signal pin is in the untriggered state, the SIM card interface control chip is turned on, and the SIM card interface drive chip drives the SIM card interface control chip to operate.

10. The electronic device as recited in claim 9, wherein when a SIM card is plugged into the integrated interface, the detection signal pin is not triggered, and the SIM card interface control chip is turned on, and the SIM card interface drive chip drives the SIM card interface control chip to operate; when a USB interface connector is plugged into the integrated interface, the detection signal pin is triggered, the USB interface control chip is turned on, and the USB interface drive chip drives the USB interface control chip to operate.

11. The electronic device as recited in claim 8, wherein the integrated interface comprises two SIM card interface control chips, each of the two SIM card interface control chips comprises a first power signal pin, a clock signal pin, a data signal pin, a programming voltage pin, a first ground pin and a reset signal pin.

12. The electronic device as recited in claim 11, wherein the USB interface control chip is a Type-C interface control chip, the Type-C interface control chip comprises a third-power signal pin, a sending positive signal pin, a sending negative signal pin, a voltage detection pin, a third ground pin, a second-wire positive pin, a fourth-power signal pin, a receiving positive signal pin, a receiving negative signal pin, an auxiliary signal pin, a fourth ground pin, and a second-wire negative pin.

13. The electronic device as recited in claim 12, wherein the third power signal pin is electronically connected to the first power signal pin, the sending positive signal pin is electronically connected to the clock signal pin, the sending negative signal pin is electronically connected to the data signal pin, the voltage detection pin is electronically connected to the programming voltage pin, the third ground pin is electronically connected to the first ground pin, the second-wire positive pin is electronically connected to the reset signal pin, the fourth-power signal pin is electronically connected to the first power signal pin, the receiving positive signal pin is electronically connected to the clock signal pin, the receiving negative signal pin is electronically connected to the data signal pin, the auxiliary signal pin is electronically connected to the programming voltage pin, the fourth ground pin is electronically connected to the first ground pin, and the second data line negative pin is electronically connected to the reset signal pin.

14. The electronic device as recited in claim 12, wherein the USB interface drive chip is a Type-C interface drive chip.

\* \* \* \* \*